United States Patent [19]
Nakashima

[11] Patent Number: 5,351,213
[45] Date of Patent: Sep. 27, 1994

[54] INTEGRATED SEMICONDUCTOR MEMORY DEVICE UTILIZING A TEST CIRCUIT

[75] Inventor: Takashi Nakashima, Seoul, Rep. of Korea

[73] Assignee: Samsung Electronics Co., Ltd., Kyounggi, Rep. of Korea

[21] Appl. No.: 843,260

[22] Filed: Feb. 28, 1992

[30] Foreign Application Priority Data

Oct. 14, 1991 [KR] Rep. of Korea ............... 91-18043

[51] Int. Cl.$^5$ ............................................. G11C 13/00
[52] U.S. Cl. ................................. 365/201; 371/21.1; 257/359; 257/381; 257/385
[58] Field of Search ................ 365/201, 161, 163; 257/359, 377, 381, 385; 371/21.1, 21.2, 22.5

[56] References Cited

U.S. PATENT DOCUMENTS

| | | | |
|---|---|---|---|
| 4,604,641 | 8/1986 | Konishi | 257/385 |
| 4,792,841 | 12/1988 | Nagasawa et al. | 257/385 |
| 5,060,230 | 10/1991 | Arimoto et al. | 365/201 |
| 5,088,063 | 2/1992 | Matsuda et al. | 365/201 |

FOREIGN PATENT DOCUMENTS 0372770  3/1991  Japan .

OTHER PUBLICATIONS

SDM 89-31: A Memory Architecture for 16Mb DRAMs (published on Jun. 21, 1989).
SDM 89-32: A 55ns 16Mb DRAM with Built-in-Self-Test Function Using Micro-Program ROM (published on Jun. 21, 1989).
SDM 90-199: A 64Mbit DRAM with Merged Match--line Test Architecture (published on Mar. 27, 1991).

*Primary Examiner*—Eugene R. LaRoche
*Assistant Examiner*—Vu A. Le
*Attorney, Agent, or Firm*—Cushman Darby & Cushman

[57] ABSTRACT

A semiconductor memory device of the type having a test circuit incorporated integrally therewith generates test data to be batch written into the device's memory cells. The memory device includes at least one memory block to which there may be connected sense amplifiers through which read/write operations can be effected. A test circuit is also provided which function is to test each memory block. A peripheral circuit is formed electrically connected to any memory blocks. Accordingly, memory blocks as well as the peripheral circuit are formed on a semiconductor substrate onto which there is formed a 'single' layer having both high (undoped thin poly-Si current paths-108CH) and low (doped thin poly-Si joint path-108SD) resistivity regions therein. The inherent properties of the undoped high-resistivity current paths 108 CH are such that in response to control signals from control gate electrodes, an electrical conductance of the current paths can be altered. The resultant structure yields improvements in manufacturing costs, test time and ancillary costs associated with memory block testing.

4 Claims, 5 Drawing Sheets

INTEGRATED SEMICONDUCTOR MEMORY DEVICE UTILIZING A TEST CIRCUIT

FIELD OF THE INVENTION

The disclosed invention relates to an integrated semiconductor memory device, particularly to one which employs a test circuit for writing test data into a memory block in batch. A test data transfer line and the channel of a test data switching transistor are formed by either a polycrystalline silicon layer or an amorphous silicon layer. The test circuit of the present invention can also include means for testing values between read out data. The test circuit employs either polysilicon transistors or amorphous silicon transistors for performing logic operations.

BACKGROUND OF THE INVENTION

Generally, as semiconductor memory devices become more integrated and smaller, the degradation rate of the wiring for on-chip conductive lines becomes markedly greater as the pitch between wires become narrower. In addition, manufacturing yield decreases with increasing integration of a memory device and an inner defect rate increases as chips become larger in size.

Integrated read-write semiconductor memory devices employing field effect transistors for most or all main memory cell elements, require that a test operation be carried out during the fabrication process to verify memory performance. Excessively high test costs of high density memory chips is capable of influencing the fabrication process. Test costs are usually a large portion of total manufacturing costs. Such test costs include charges for using a testing apparatus as well as other depreciation and incidental costs. A large portion of total costs are associated with the use of a test apparatus, and the remaining portion is the result of depreciation and incidental costs.

As test time for an integrated memory device becomes unavoidably long, a memory circuit's density should be reduced to at least improve reliability in fabrication. Reduced density leads not only to reduced test time but also to reduced dependence on determinations of product reliability on test results.

Reducing test costs in the manufacturing of memory devices is an ongoing effort. A parallel test with a multi-bit data scheme has recently been proposed. Such a scheme, however, is problematic because it requires an expensive test apparatus operating at high speeds. This scheme is also subject to high incidental costs.

Different additional schemes have further been proposed such as those disclosed in a Technical Research Report published by Japanese Institute of Electronics, Information and communication SDM 89-31, 32(filed on Jun. 21, 1989) and in SDM 90-199 (filed on Mar. 27, 1991), both discussing a line mode test (LMT) scheme and a self test (ST) scheme.

In the SDM 89-31 paper ("A memory array architecture adaptable for a 16-Mb DRAM"; hereinafter referred to as "Ref.1"), shown in FIG. 1, the disclosed circuit is provided with a comparator circuit 1 and a multi-purpose register 2 functioning in LMT mode to parallel test the memory chip. This circuit reduces test time over earlier test circuits. The LMT tests all memory cells connected to a batch-writing signal thus increasing the number of data bits that can be tested. By employing multi-purpose register 2 as a data register and as a data-of-reckoned value register (which 'data-of-reckoned value' is the expected value of readout data), a random pattern test is possible and a sufficient reduction in test time is realized.

In the SDM 89-32 paper ("A 55-ns 16-Mb DRAM using a self test scheme"; hereinafter referred to as "Ref. 2"), a circuit is disclosed which shortens test time by packaging data bits into parts or into a net. The techniques disclosed are aimed at reducing costs during testing operations.

The disclosed way to reduce test time is by simplifying or streamlining the test operation. For example, a BIST (built in self test) scheme automatically initiates a test function in response to a test enable clock applied externally from the chip. Thus chips can be randomly tested. A memory board having memory chips embedded thereon and tested with a BIST circuit may have a short test time. Consequently, test costs are reduced and the partial function of an LSI tester is substituted by the BIST circuit.

The specific circuit architecture of this Ref. 2 is shown in FIG. 2. This circuit includes ROM 21 for storing the sequential program steps for a test operation, program counter 22 for controlling ROM 21, address counter 23 for generating test addresses, data generator 24 generating test data, data comparator 25 for comparing the test data with data read from memory cells, and test clock generator 26 for providing a first signal to control the timing of each circuit and a second signal to control the main memory body during self test operation.

The operation of the self test circuit of FIG. 2 and the respective functions of circuit elements will be described in connection with a description of a matching test mode. A matching test is accomplished by the program operation of twelve steps, each step corresponding to a step in the test cycle. The steps consist of:

a primary step for initializing the test circuit, corresponding to clear cycle;

a first step for writing data of logic level "0" as background data into all memory cells;

second and third steps comparing 'reckoned write data' logic level "0", which might be written with data retrieved from a respective memory cell and writing data "1" thereto instead—repeating steps two and three for each bit counting up from the first bit to the Nth bit;

a fourth and fifth steps for performing the second and third steps on the basis of complementary data;

a sixth to tenth steps for repeating steps two through five for each bit counting down from the Nth bit to the first bit; and an eleventh step for generating a flag to terminate the test operation.

In this test operation, although an error is detected during the sequential processing of the above steps, the sequence goes to termination without pause, with the exception that an error condition acknowledgement is made to the outside.

Referring to the SDM 90-199 paper ("A 64-Mb DRAM in the scheme of merged match-line test"; hereinafter referred to as "Ref. 3") to be discussed in connection with FIG. 3A, this paper discloses test times as a function of the various types of DRAM devices. As illustrated, bit-by-bit test accessing can exhaust ten seconds of test time in which time every cell data in a 64-Mb DRAM would have been read out. A shipping test of several ten items requires more than one hour to completely perform a test operation thereof—a shipping test being necessary to check an IC before it is shipped.

A multi-bit test scheme (MBT), performing four bit testing in a 1-Mb DRAM, has also been proposed. The MBT scheme, however, is not suited for 4-to 64-Mb DRAMs. The sufficient reduction in test time of an MBT test may not be achieved as the size of test data cannot override as many as those for 16 to 64 bits. Additionally, such a scheme requires several thousand preamplifiers in order to parallel test several kilo bits, a clear limitation when reducing chip size is a critical design factor.

Because of problems in other proposed schemes, the LMT scheme operating on a batch-testing basis of all bits on each word line has been most successful in efforts sharply to reduce test time in high density DRAMS. The LMT scheme, however, requires exclusive match lines (wires) for transferring reference data, as well as comparators associated with corresponding pairs of bit lines.

In the MMT scheme disclosed in Ref. 3, data output lines used under normal write mode are functionally converted to serve as match lines. Similarly, the portion of the chip operating as a differential amplifier in normal read mode operates as a wired-OR circuit. Consequently, test circuit chip area is not greater than 0.1 percent of total chip area. A comparison between the conventional LMT and MMT schemes is shown in FIG. 3B. The MMT scheme, much like the LMT scheme, performs a test operation for several kilo bits of batch data at a time. Read-out time for a 64-Mb DRAM is completed in 614 μs, with a cycle time of 150 ns (refer to FIG. 3A).

The speed-up of access time during actual use together with reduction in test time are essential factors in DRAM test circuit design. To achieve greater speed-up of access time in an MMT scheme, the chip architecture is provided with data output and input lines such that data read out from selected memory cells are amplified using sense amplifiers as well as differential amplifiers to achieve an access time of 45 ns.

Despite good performance characteristics of an MMT, potential for improvement of this test circuit was always thought possible.

Thin transistor technology wherein transistor channels are formed using a polycrystalline or amorphous silicon layer has been employed in liquid crystal devices and SRAM (static random access memory) devices.

Because circuit elements are fabricated on a semiconductor substrate, the addition of elements necessarily causes chip size to increase. Hence, when a unit cost for fabricating a chip is high as to increase the overall product cost despite low costs of a testing apparatus, it is impossible to reduce overall test and product costs.

SUMMARY OF THE INVENTION

Accordingly, it is an object of the present invention to provide a semiconductor integrated memory device utilizing a test circuit which can sufficiently reduce test time.

It is another object of the present invention to provide a semiconductor integrated memory device utilizing a test circuit which can reduce testing costs.

It is a further object of the present invention to provide a semiconductor integrated memory device utilizing a test circuit which can reduce the overall cost for fabricating a chip despite the addition of further circuit elements.

Above mentioned and other featured objects of the present invention will become more apparent by reference to the following description taken in conjunction with the accompanying drawings.

BRIEF DESCRIPTION OF THE DRAWINGS

The foregoing feature of this invention, as well as the invention itself, may be more fully understood from the following detailed description.

DETAILED DESCRIPTION OF THE INVENTION

Figure 1:
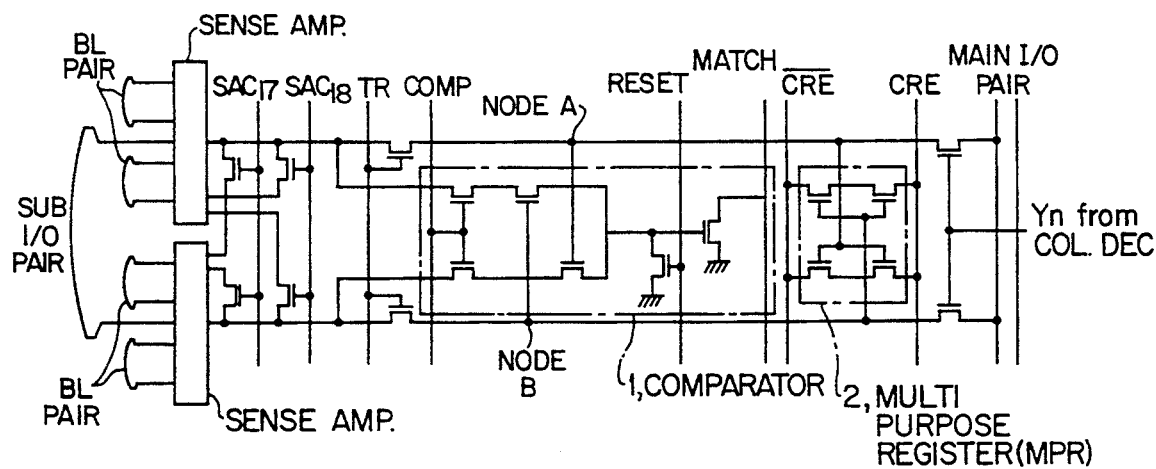
FIG. 1 is a test circuit diagram including a multi-purpose register and comparator combination for use in a conventional integrated semiconductor memory device.
Figure 2:
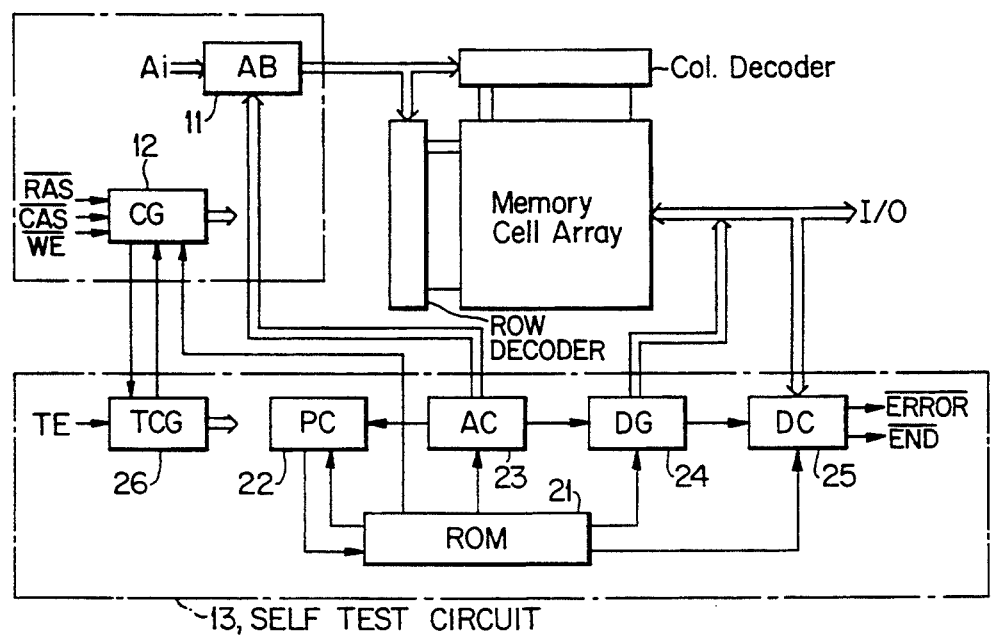
FIG. 2 is a block diagram of a memory device utilizing a conventional self-test scheme and including a ROM.
Figure 3A:
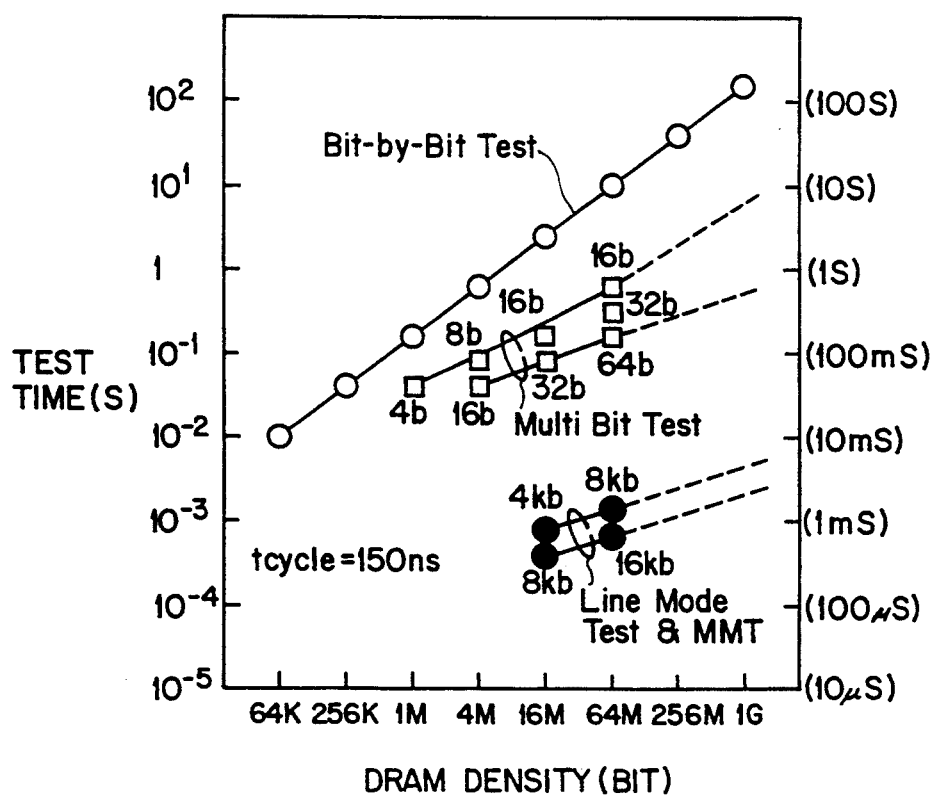
FIG. 3A is a graphic diagram of test times for various generations of DRAM devices.
Figure 3B:
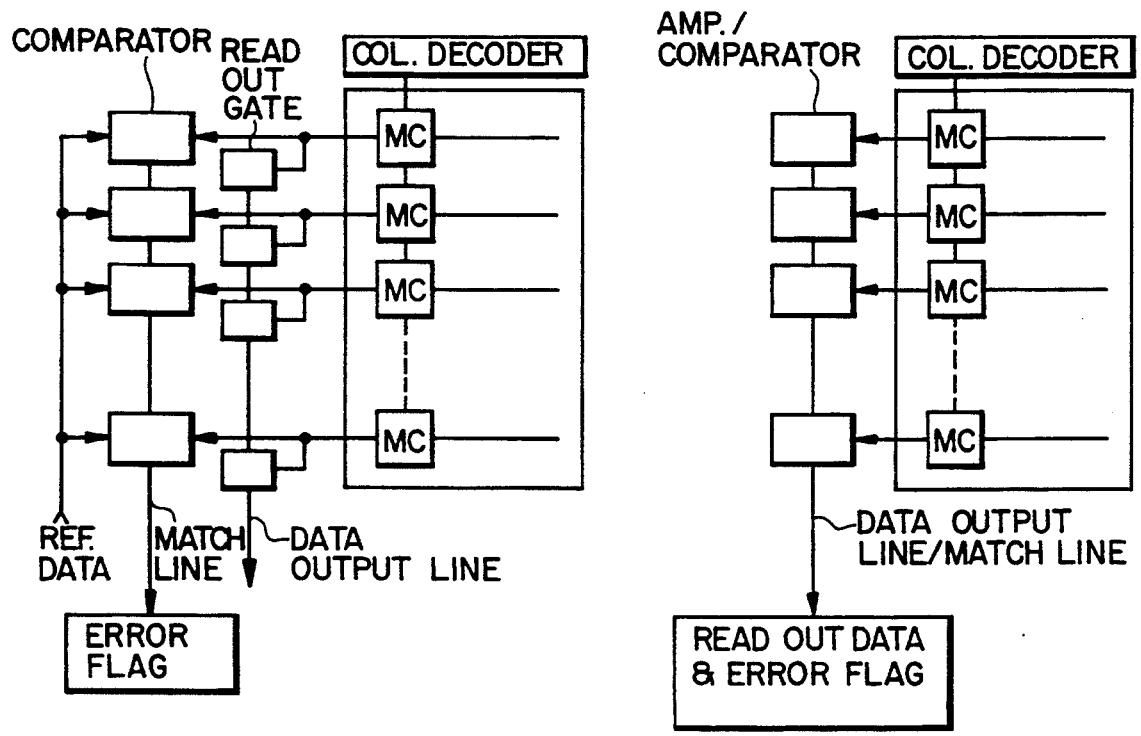
FIG. 3B is a schematic diagram illustrating structural comparisons between the conventional LMT and MMT schemes.

The LMT circuit is more simple than any other one of assistant test circuits, but because of the need of a test mode switching transistor (corresponding to the two FETs shown in FIG. 1 having their respective gate electrodes connected to signal COMP), a write circuit (e.g., registers MPR in FIG. 1) and an output test circuit (e.g., comparator stage of FIG. 1), chip size is unavoidably large.

Given the fact that a plurality of layers made of polycrystalline silicon and metal are used in present integrated circuits, an upper polycrystalline silicon layer or an additional layer of polycrystalline or amorphous silicon can be used for a channel of a field effect transistor (FET) having a gate made of an upper or a lower conductive layer (such as monocrystalline, polycrystalline, silicide and metal layer) and isolated by a gate insulating layer. Interconnecting wires may in turn be connected to such a conductive layer.

As a result, a test circuit can be densely designed along an area of a peripheral circuit such as a decoder section, such that a predetermined arrangement rule for the test circuit will not be subject to any lateral size limitation on chip design. Thus, also minimizing chip size.

A FET channel made of polycrystalline or amorphous silicon layer is subject to a greater amount of leakage current and a low turn-off resistance when the FET is turned off, as well as a high turn-on resistance. These problems become negligible by careful selection of voltage and current levels, as well as appropriate frequency and amplitude levels, of the pulse signals to be used in the testing.

Figure 4:
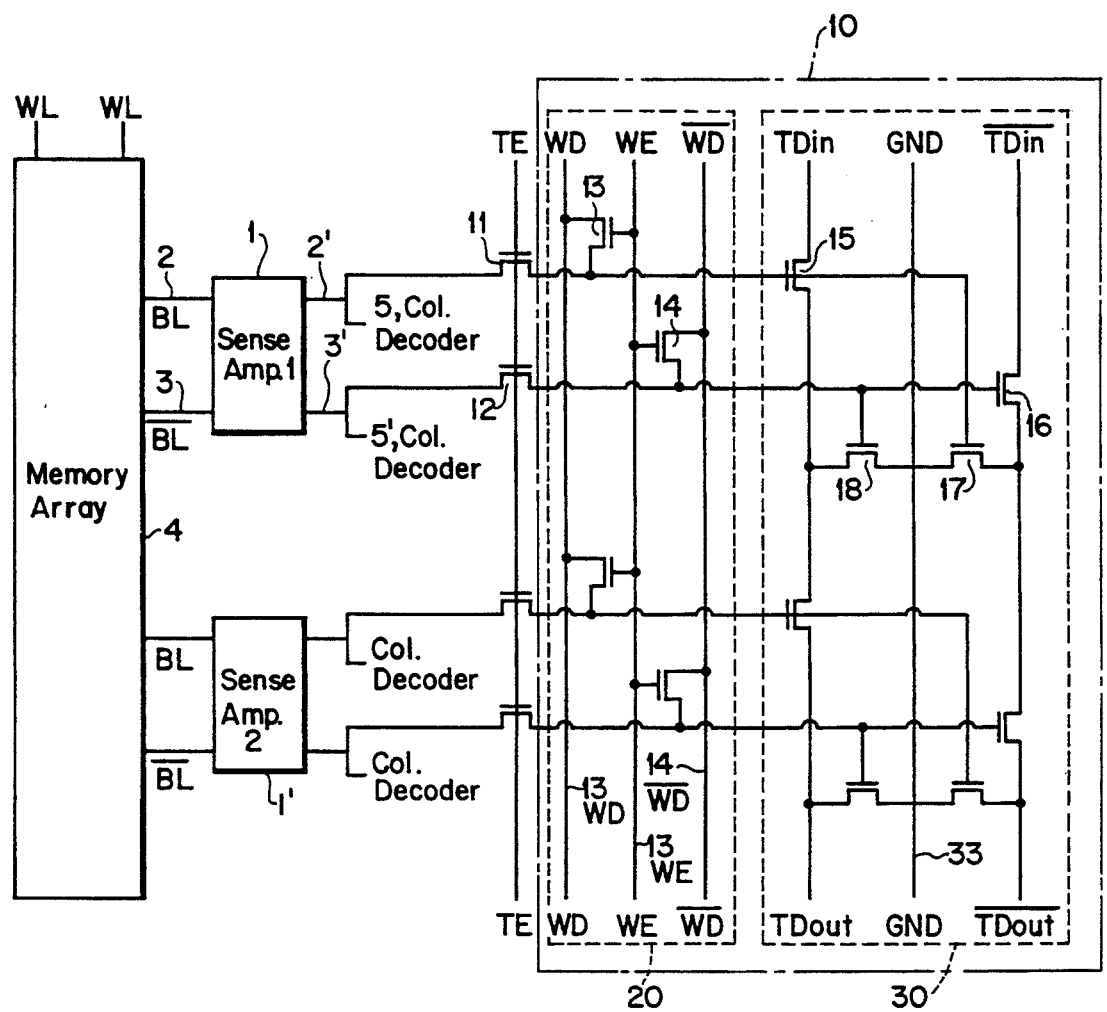
FIG. 4 is a block circuit diagram illustrating an embodiment of the present invention.

By way of example, in the output test circuit shown in FIG. 4, FETs to be turned-off and corresponding FETs to be turned-on form a ladder style voltage divider whereby 128 turn-on FETs (15) are serially connected along TDin-TDout line and 128 turn-off FETs (18) are connected between ground terminal and respective connecting nodes of the serially connected turn-on FETs (15). Under normal conditions, the ratio of voltage values of output data-to-input data (TDout/TDin) goes up by more than 38% (an ideal value of 100%) and the ratio of turn-off resistance to turn-on resistance is greater than 0.01%. Conversely, during data reversing conditions, the TDout/TDin ratio is below 0.01%. This is verified mathematically as:

$$(TDout/TDin) > (Roff/Ron)/(Ns \times Ns + (Roff/Ron)) = 0.379$$

where
Roff = turn-off resistance
Ron = turn-on resistance
Ns = number of transistors serially connected from TDin through TDout With regard to write operations in test mode, a low turn-on resistance value may be necessary. This value should be lower than one tenth the impedance value of coupled sense amplifiers which would include any capacitance parameters. Similarly, a high value of turn-off resistance may also be required. This high value should be larger than ten times sense amplifier impedance, the impedance being a time-averaged voltage/current ratio at the input/output terminals of the respective sense amplifier.

A minimum ratio of the turn-off resistance to the turn-on resistance in the switching FET is about 100:1, optimizing the value of the turn-on resistance.

Referring to FIG. 4, each of all sense amplifiers 1,1' shown in the drawing has the same structure.

First sense amplifier 1 is coupled to memory array 4 via a pair of bit lines BL 2,2' and $\overline{BL}$ 3,3'. These bit lines are used for both input and output and are coupled to a column decoder 5,5' respectively. Bit lines, 2,3 and sense amplifiers 1,1' are shown having a folded bit line architecture, however, an open bit-line architecture can be easily adapted instead. Both input terminals of first sense amplifier 1 are coupled to test circuit 10 via transistors 11,12, respectively. Test circuit 10 includes write circuit 20 which applies simultaneously test data, which data is provided through connecting terminals or alternatively generated within the memory device, to a plurality of sense amplifiers 1,1', and a comparator 30 which detects whether outputs from sense amplifiers 1,1' are equal. Transistors shown are N channel FETs as shown explicitly in FIG. 4.

To write test data into memory array 4 through sense amplifiers 1,1', transistors 11,12 are turned-on by setting test enable signal TE to a logic high state and by also raising write enable signal WE to a logic high state. Complementary test data WD, $\overline{WD}$ are then applied to first sense amplifier 1 via transistors 13,14,11 and 12. The logic level of test data WD and $\overline{WD}$ is selected in accordance with the logic level of the signal to be written into memory and the bit line to be used for such writing.

To next read out test data written in memory array 4, signal WE is disabled (low logic level) and signal TE is maintained active (high level). The level of sensing signals TDin and $\overline{TDin}$ is selected on the basis of the logic levels of test data WD and $\overline{WD}$. For example, when WD is logic high level during a write operation, TDin is selected be high. If $\overline{WD}$ was logic high level during a write operation, then $\overline{TDin}$ is selected high.

The resultant determination of whether data read out from memory array 4 is equal to the test data previously written thereto is performed by detecting the value of voltage levels appearing at output terminals TDout and $\overline{TDout}$. Too small a value is an indication that the chip under test is bad since data is insufficiently accessed at given logic levels.

Transistors 13–18 employed in write circuit 20 and comparator 30 are thin film transistors 13–18. Transistors 11 and 12 are monocrystalline N-channel MOS field effect transistors connecting first sense amplifier 1 to test circuit 10 when test enable signal TE is set to logic high level.

Figure 5:
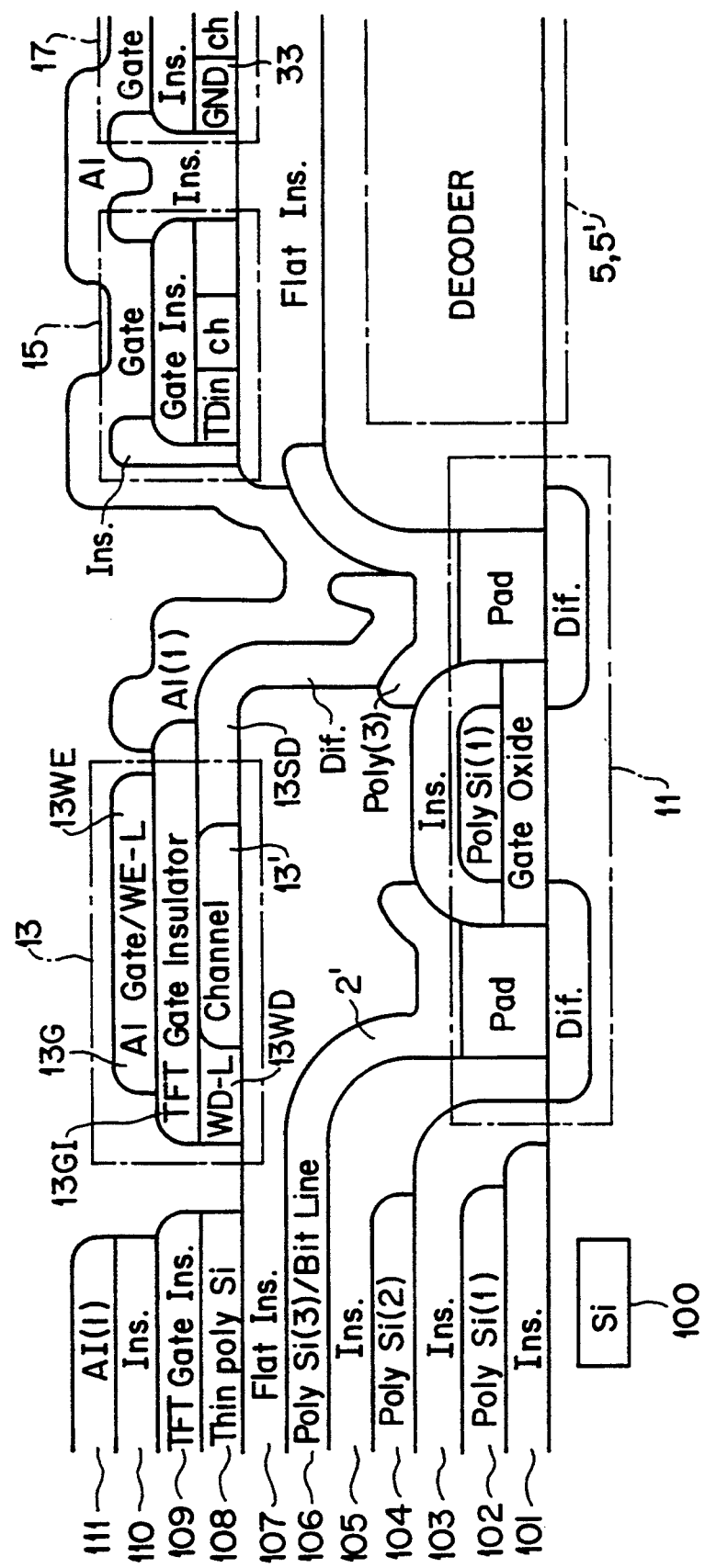
FIG. 5 is a conceptual sectional view of the integrated circuit of FIG. 4 in accordance with the present invention.

FIG. 5 shows a conceptual schematic layout of thin film transistors 13, 15, 17 as would be laid out with a normal MOS transistor 11. This architecture is applicable to an integrated memory circuit provided with triple conductive layers of polycrystalline and one conductive layer of metal. A third polycrystalline layer 106 is used for bit line 2'. Write data WD is transferred through thin polycrystalline layer 13WD as write enable signal WE runs on Al layer 13WE. Lines for receiving test data TDin, $\overline{TDin}$ and GND line 33 connected to a reference voltage value are all shown.

TFT 13 includes a channel 13', a source 13WD and a drain 13SD including a connector 13SD made of thin polycrystalline silicon layer 108, a gate insulating film 13GI made of $Si_3N_4$ and a gate electrode 13G made of aluminum 111. Thin polycrystalline 108 is more suitable for formation of a TFT than is amorphous silicon. A portion of the thin polycrystalline silicon layer used to form channel 13' in transistor 13, as well as WD line, 13WD must be doped with impurity material. The doping process is performed by ion implantation following the formation of gate insulating film 109. At that time, the injected range of ions must be controlled to prevent injection into polysilicon layer 106 beneath gate insulating film 109 which gate insulating film is made from $Si_3N_4$. The etch ratio of a $Si_3N_4$ material when compared to a $SiO_2$ material as may be used to form an insulator 110 over gate insulating film 109 can be sufficiently different.

Figure 6:
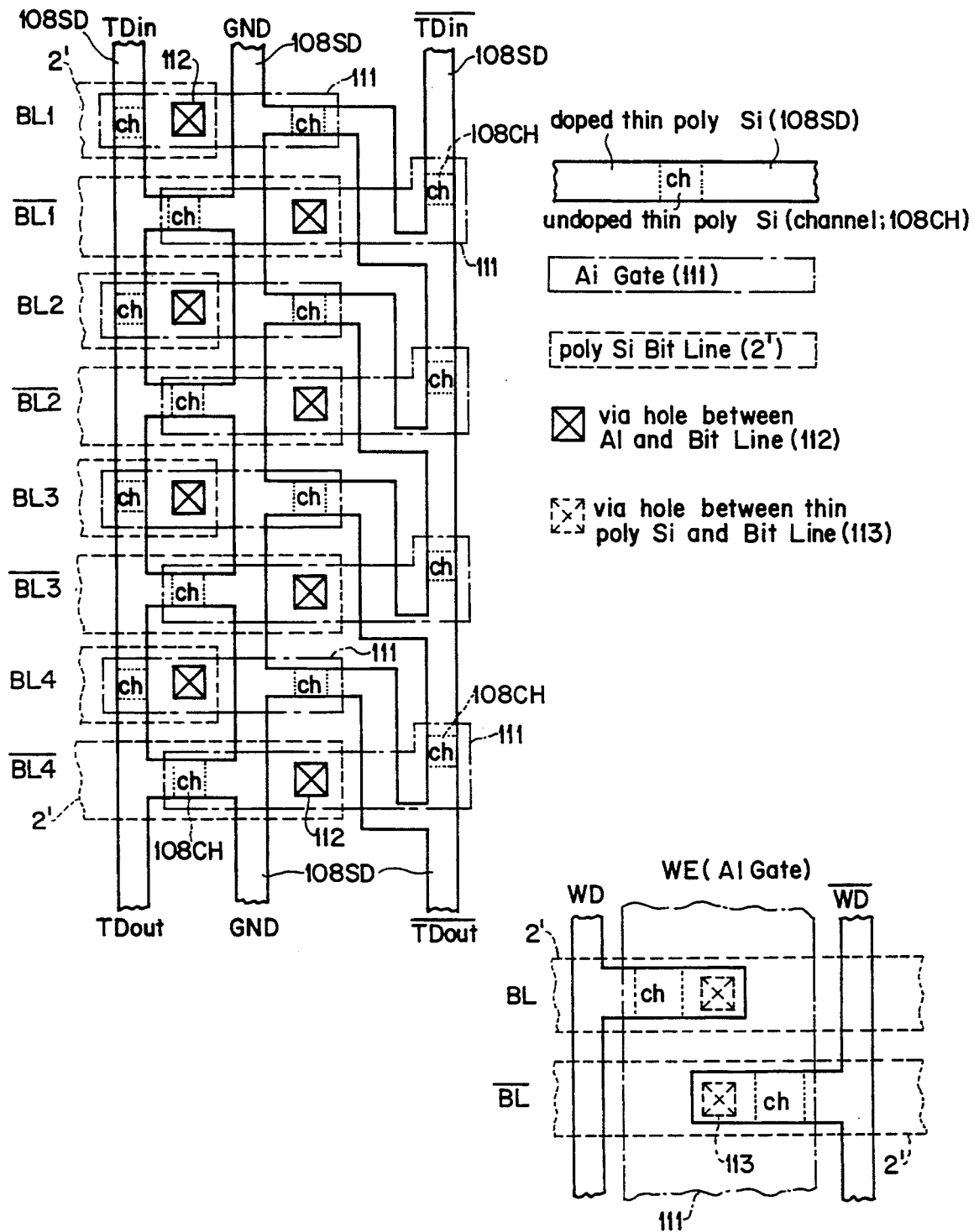
FIG. 6 is a plan view of a test circuit in accordance with an embodiment of the present invention.

FIG. 6 shows a plan arrangement of a core portion of a test circuit as shown in FIG. 4. Referring to FIG. 6 in conjunction with FIG. 5, there are formed, by reference to an uppermost layer first and working downward, aluminum gate layer 111, TFT gate insulating film 109, thin polycrystalline silicon layer 108 (see FIG. 5), an insulating layer 107 (also see FIG. 5) and bit lines 2' corresponding to polycrystalline silicon layer 106.

Each layer has a given pattern and each insulating layer comprises a contact hole such as 112, 113 for connecting conductive layers. Thin polycrystalline silicon layer 108 is shown divided into two parts, a channel 108CH which is not doped and a conductor 108SD which is doped with impurities.

Although the embodiment of the invention shown in FIG. 4 to FIG. 6 is described in connection with a structure having three poly-silicon layers, the present invention can be otherwise extended to include a decoder portion as shown in FIG. 5 formed also from a three poly-silicon layer based construction. In such a situation, a forth polysilicon layer can be adapted as a bit line. In another situation which includes using an aluminum layer to couple a bit line to memory array 4, the Al layer can be connected to the appropriate conductive layer through a contact hole.

As described above, the present invention concerns an improved integrated memory device test circuit provided with TFT technology so as not to increase chip size. The resultant device test circuit is found to reduce overall fabricating costs of the chip. Furthermore, because test data is written into and read out from a memory array in batch mode, test time is short. Also, in memory devices having a memory array combined with TFT technology, the present invention obviates the need of adding additional layers during chip fabrication.

I claim:

1. An integrated semiconductor memory device including a memory block, a peripheral circuit portion and a test circuit portion, said memory block having therein a plurality of sense amplifiers, said test circuit portion performing testing of said memory block and including a semiconductive layer including a channel part and a conductor part, said semiconductive layer being disposed over a substrate having formed thereon said memory block and said peripheral circuit portion, said test circuit portion further including:

a plurality of channels derived from said channel part and having a turn-off resistance and a turn-on resistance;

a plurality of gate electrodes respectively coupled to said channels; and a plurality of conductors derived from said conductor part electrically connecting adjacent ones of said channels together such that said gate electrodes can electrically switch a thin film FET having said channels and said gate electrodes.

2. An integrated semiconductor memory device according to claim 1, wherein said peripheral circuit portion includes a plurality of transistors for connecting said test circuit portion to said sense amplifiers when a test enable signal is set to a logic high level.

3. An integrated semiconductor memory device according to claim 1, wherein said conductors electrically connect an adjacent three of said channels together.

4. An integrated semiconductor memory device according to claim 1, wherein one of said conductors is connected to one of said channels to apply test data to said sense amplifiers via a transistor having said one of said channels, during a write enable signal which is a logic high level signal.

* * * * *